(12) United States Patent
Sacks et al.

(10) Patent No.: US 9,136,419 B2
(45) Date of Patent: Sep. 15, 2015

(54) PHOTOCONDUCTIVE DEVICE

(75) Inventors: Robert N. Sacks, Ann Arbor, MI (US); Matthew M. Jazwiecki, Canton, MI (US); Steven Williamson, Ann Arbor, MI (US)

(73) Assignee: PICOMETRIX, LLC, Ann Arbor, MI (US)

( * ) Notice: Subject to any disclaimer, the term of this patent is extended or adjusted under 35 U.S.C. 154(b) by 0 days.

(21) Appl. No.: 11/718,959

(22) PCT Filed: Dec. 7, 2005

(86) PCT No.: PCT/US2005/044620
§ 371 (c)(1),
(2), (4) Date: May 9, 2007

(87) PCT Pub. No.: WO2006/063233
PCT Pub. Date: Jun. 15, 2006

(65) Prior Publication Data
US 2008/0093625 A1    Apr. 24, 2008

Related U.S. Application Data

(60) Provisional application No. 60/633,862, filed on Dec. 7, 2004.

(51) Int. Cl.
*H01L 31/09* (2006.01)
*H01L 31/0304* (2006.01)
*H01L 29/737* (2006.01)

(52) U.S. Cl.
CPC ............ *H01L 31/09* (2013.01); *H01L 29/7371* (2013.01); *H01L 31/03046* (2013.01)

(58) Field of Classification Search
CPC .............. H01L 31/09; H01L 31/03046; H01L 29/7371
See application file for complete search history.

(56) References Cited

U.S. PATENT DOCUMENTS 6,188,081 B1 *   2/2001   Liu et al. ......................... 257/12

* cited by examiner

*Primary Examiner* — Long Pham
(74) *Attorney, Agent, or Firm* — Brinks Gilson & Lione

(57) ABSTRACT

A semiconductor structure includes a GaAs or InP substrate, an $In_xGa_{1-x}As$ epitaxial layer grown on the substrate, where x is greater than about 0.01 and less than about 0.53, and a wider bandgap epitaxial layer grown as a cap layer on top of the $In_xGa_{1-x}As$ epitaxial layer.

12 Claims, 3 Drawing Sheets

PHOTOCONDUCTIVE DEVICE

RELATED APPLICATION

This application claims the benefit of U.S. Provisional Application No. 60/633,862, filed Dec. 7, 2004, the entire contents of which are incorporated herein by reference.

BACKGROUND

This invention relates to epitaxially grown semiconductors.

To generate a picosecond or subpicosecond electrical transient from a laser pulse requires the use of a specially processed semiconductor, most likely low-temperature grown GaAs (LT-GaAs). A photoconductive switch based on this material can respond quickly to short laser pulses and yields fast electrical transients when configured as a pulse generator. It can also be configured as a sampling gate to enable a brief (picosecond) segment of an unknown electrical waveform to be sampled and measured. By sequentially sampling all segments making up the electrical waveform, the shape of the waveform can be reconstructed and displayed, which is the essence of a sampling oscilloscope. The faster the sampling gate, the faster an electrical waveform that can be measured. Radiation damaged silicon on sapphire can also be used as the base semiconductor for a photoconductive switch, although it possesses less desirable photoconductive properties than LT-GaAs. A condition for good switching efficiency is that the laser's wavelength be strongly absorbed in the semiconductor. For GaAs, that means a wavelength of 880 nm or shorter, which corresponds to a photon energy equal to the bandgap of GaAs, which is 1.42 eV. A wavelength longer than 880 nm passes through the semiconductor without being significantly absorbed.

The requirement for strong absorption stems from the need to have all the photogenerated electron-hole pairs (carriers) reside in the high electric field region of the photoconductive gap. Carriers formed deeper than this region play no appreciable role in the photoconductive process. The electric field has a depth approximately that of the electrode spacing (0.50-2.0 µm) that forms the photoconductive switch, although the strongest field lines are those within the first micrometer of the surface.

Femtosecond ($10^{-15}$ s) pulse lasers do exist that absorb well in GaAs (and silicon) and have been used for the past 25 years to generate picosecond and subpicosecond electrical pulses. Such lasers, one of the most common of which being Ti:sapphire (lasing at 800 nm), are large, water-cooled and expensive to purchase and maintain. They cannot be amplified using optical fiber amplifiers, and fiber components at this wavelength are difficult (if not impossible) to manufacture, requiring instead the use of free-space optics.

The ideal source is one that is compatible with other telecom components and can be directly pumped with a common semiconductor pump laser. It has sufficiently broad emission band to support femtosecond pulses. It also has a wavelength suitable for fiber amplification. Additionally, it is power-efficient, air-cooled, compact and Telcordia-qualified for maintenance-free, long-life operation. New telecommunication laser technologies have made possible two such lasers, classified by their operating wavelengths. They are: Er:Glass lasers operating at 1550 nm and Nd:Glass or Ytterbium, both operating at 1060 nm. These wavelengths generate near-zero photocurrent in GaAs. To take advantage of these new sources requires development of a new semiconductor tailored to these wavelengths.

To use either of these wavelengths means that the semiconductor's bandgap must be made equal to or less than the photon energy of the laser light. The approximate bandgaps for 1060 nm and 1550 nm are 1.15 eV and 0.8 eV, respectively. A commonly used semiconductor in the telecommunications industry, $In_{0.53}Ga_{0.47}As$ grown on InP, does have a bandgap of 0.77 eV and strongly absorbs light out to 1650 nm. Unfortunately, this semiconductor like all reduced-bandgap semiconductors suffers a serious limitation when configured as a photoconductive switch.

SUMMARY

In a general aspect of the invention, a semiconductor structure, for example, a photoconductive switch, includes a GaAs or InP substrate, an $In_xGa_{1-x}As$ epitaxial layer grown on the substrate, where x is greater than about 0.01 and less than about 0.53, and a wider bandgap epitaxial layer grown as a cap layer on top of the $In_xGa_{1-x}As$ epitaxial layer.

The switch enables subpicosecond-duration electrical pulses to be generated and/or sampled using a sub-picosecond laser whose wavelength is longer than, for example, 880 nm.

The $In_xGa_{1-x}As$ layer may have a thickness in the range between about 0.1 and 2.0 µm, and the wider bandgap epitaxial cap layer may have a thickness in the range between about 50 and 1000 Å. The wider bandgap epitaxial cap layer can be InP. Alternatively, the cap layer can be stoichiometric GaAs or nonstoichiometric GaAs, stoichiometric AlGaAs or nonstoichiometric AlGaAs, or stoichiometric InAlAs or nonstoichiometric InAlAs. A nonstoiciometric epitaxial layer is typically grown at a temperature hundreds of degrees below the temperature needed to grow normal, a stoichiometric epitaxial layer.

The switch 10 may be subjected to an in-situ or ex-situ post annealing process after the epitaxial structure is grown. The post annealing temperature may be in the range between about 400 and 700 C, and the post annealing duration may be in the range between about 5 and 30 min.

The switch may be patterned and etched down to the substrate except for a small region or mesa that remains unetched, which is substantially round in shape with a diameter in the range between about 10 and 100 µm. An electrically insulating, photo-defined dielectric film may be deposited over the surface of the semiconductor structure except in a region, defining a window, centered over the top surface of the mesa. The photo-defined window in the dielectric film may be substantially round in shape and smaller in diameter than the top diameter of the mesa. For example, the dielectric film can have a diameter in the range between about 5 and 90 µm. Electrical contacts with two thin film electrodes may be deposited on the dielectric film with a gap between them that is positioned such that the gap and portions of each electrode are in the window of the dielectric film and make contact with the top semiconductor structure surface of the mesa. The semiconductor surface between the two electrodes may be coated with an antireflective coating.

In some implementations, the switch generates pulsed or sinusoidally varying electrical signals when an electrical bias is applied across the two electrodes and an optical pulse or sinusoidally varying optical signal is incident in the gap and excites carriers in the photoconductive gap. An electrically radiating antenna may be connected to the two electrodes, so that the electrical signals with subterahertz to terahertz bandwidths radiate from the antenna. In other implementations, a voltage from a pulsed or sinusoidally varying electrical waveform may be applied across the two electrodes and an optical pulse or sinusoidally varying optical signal may be incident in the gap and may excite carriers in the photoconductive gap to measure the electrical waveform. A receiving antenna may be connected to the two electrodes, so that the electrical waveform with subterahertz to terahertz bandwidths is coupled to the photoconductive gap through the receiving antenna. The substrate side may be coated with an antireflective coating and light may enter from the substrate side to excite carriers in the photoconductive gap.

Further features and advantages will be apparent from the following description, and from the claims

DETAILED DESCRIPTION

Figure 1:
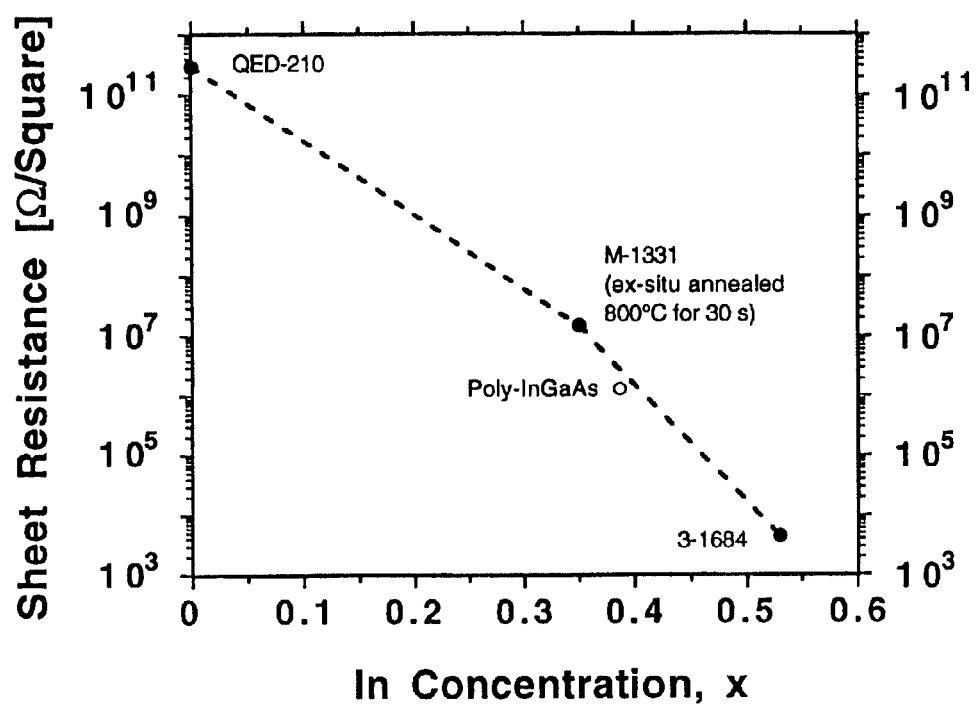
FIG. 1 displays a graph of the decrease in sheet resistance as the In concentration is increased in InGaAs.

Though seemingly similar in functionality to a photodiode, a photoconductive switch differs in several key ways:

1. The response time of a photoconductive switch can be determined predominately by the semiconductor's carrier lifetime and not by the geometry-dependent applied electric field, as is the case with a photodiode. This means that a photoconductive switch can have a subpicosecond lifetime with a gap as large as 1 µm whereas a similarly structured photodiode would have a response time of several picoseconds. It also means that its response time is independent of an applied electric field. A photoconductor possessing fast carrier lifetime and with a 1 mV bias across its gap will have the same response time as with a 1V bias.

2. The applied electric field across a photoconductive switch influences the amount of photocurrent it generates. By contrast, the voltage across a photodiode has little effect on its level of photocurrent. The photoconductive switch can therefore be used to sample electric waveforms (i.e. measure current) when it is configured as a sampling gate.

3. Unlike the photodiode, which is inherently a unipolar device, the photoconductive switch is bipolar and is equally capable of generating and sampling electric signals of both polarities.

There are three characteristics that set the performance of an ultrafast photoconductive switch:

1. Response time—governed largely by the RC time constant of the electrodes and the semiconductor's carrier lifetime. The response time sets the bandwidth of the switch.

2. Responsivity—determined by the amount of light absorbed in the high-field regime, the mobility of the semiconductor and series resistance across the photoconductive gap. The responsivity determines the maximum pulse amplitude when the photoconductive switch is used as a pulse generator and the maximum signal size when used as a sampling gate, as in the case of a terahertz receiver.

3. Dark current—determined primarily by the semiconductor's resistivity and metal-semiconductor barriers. The dark current is mostly of interest when the switch is used as a sampling gate and sets the limit of the noise floor.

GaAs is the ideal host semiconductor for ultrafast photoconductive switch applications. When an epitaxial layer of GaAs is grown on top of the GaAs substrate under so-called non-stoichiometric conditions, the resulting layer is called low-temperature-grown GaAs or LT-GaAs. It can have subpicosecond lifetime, responsivity approaching that of a photodiode (~0.1 A/W) and dark current in the 1 nA ($10^{-9}$ A) range. It should be noted that most semiconductors, GaAs included, have an intrinsic carrier lifetime in the neighborhood of about 1 to 10 ns. It is only after a dopant, impurity or other trapping mechanism is introduced does the carrier lifetime drop to the desired picosecond or subpicosecond time scale.

Often times a dopant reduces the response time at the expense of decreasing the semiconductor's resistivity, thus increasing its dark current level, which is the case with GaAs. Growing the epitaxial layer at an unconventionally low temperature introduces excess arsenic to the GaAs lattice and reduces the semiconductor's response time. But it also has the negative effect of lowering its resistivity. It is only after the GaAs is subsequently annealed (near its normal growth temperature) does the excess arsenic begin forming nano-scale-size precipitates, which restores the semiconductor's resistivity to its high value. The response time happens to remain subpicosecond after this secondary process.

As mentioned earlier, there is a semiconductor that strongly absorbs out to 1550 nm and more accurately has its edge near 1650 nm. This material is epitaxially-grown $In_{0.53}Ga_{0.47}As$ and it is grown lattice-matched onto an InP substrate. Note that the introduction of In to GaAs to form $In_xGa_{1-x}As$ causes the lattice constant to expand. With 53% In, the lattice of the epitaxial layer expands ~3.8% to match the lattice of a InP substrate, but then no longer matches a GaAs substrate, resulting in severe crosshatch and other problems. In general, under normal growth conditions an $In_xGa_{1-x}As$ thickness of 1 µm, where x>10%, grown on a GaAs substrate causes the top surface to be visibly roughened, making it difficult to fabricate micrometer structures. The lattice constant of InP happens to be matched to $In_{0.53}Ga_{0.47}As$. Hence the reason for using a 53% In concentration. $In_{0.53}Ga_{0.47}As$ has been the mainstay semiconductor for telecom photodetectors for many years. Though ideally suited for detector applications, $In_{0.53}Ga_{0.47}As$ does not function well as a fast photoconductive switch since it has inherently low resistivity, which yields high leakage current and high sampling noise. FIG. 1 displays a graph of the decrease in sheet resistance as the In concentration is increased in InGaAs. The sheet resistance plummets nearly eight orders of magnitude as the In concentration increases from 0% to 53%.

Figure 2:
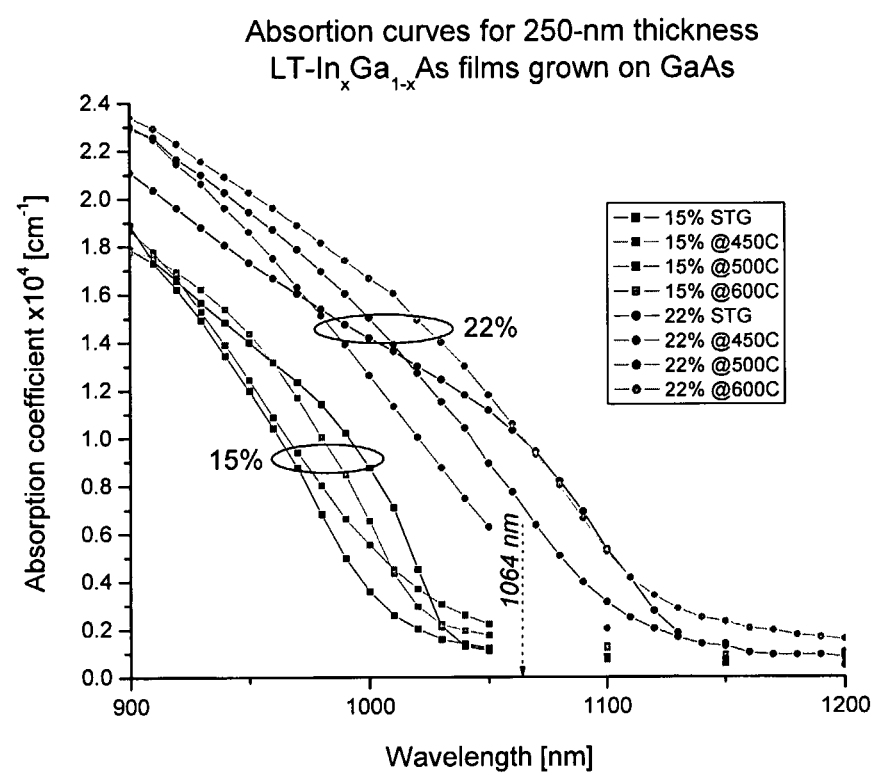
FIG. 2 displays a graph of absorption curves.
Figure 3:
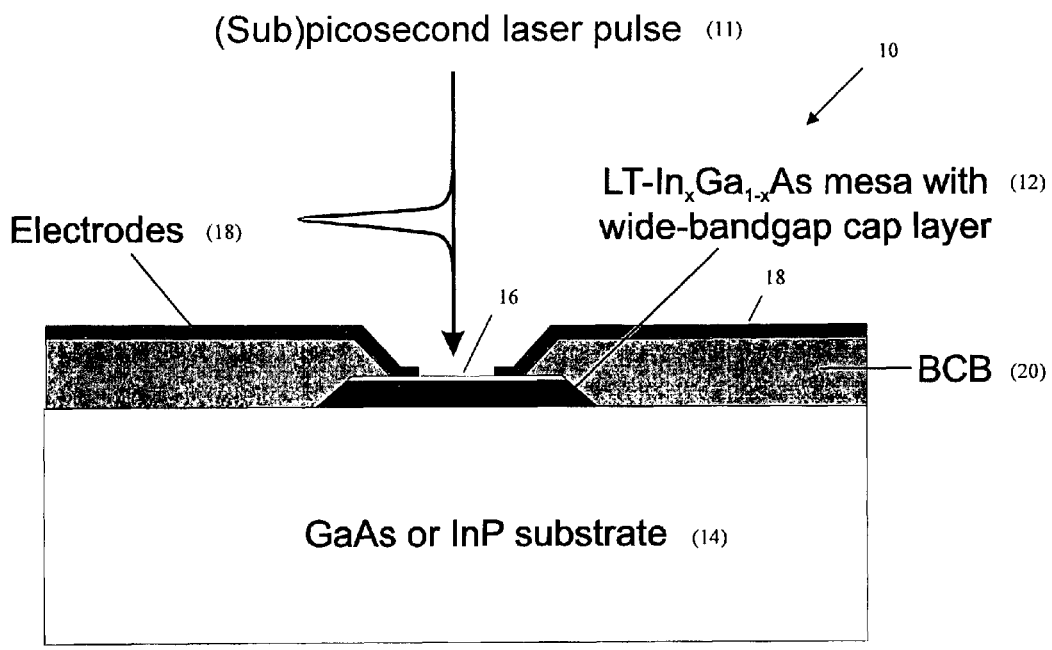
FIG. 3 depicts a photoconductive switch in accordance with an embodiment of the invention.

In accordance with the invention, rather than focusing on $In_{0.53}Ga_{0.47}As$ where the resistivity is low to the point of being unusable, the present invention focuses instead on an In concentration that matches well to 1060 nm light, which is around 22% or $In_{0.22}Ga_{0.78}As$ (see FIG. 2). Referring to FIG. 3, a photoconductive switch embodying the principles of the present invention is illustrated therein and designated at 10 and is shown interacting with an incident laser pulse 11. As its primary components, the switch includes a substrate 14, an epitaxial layer 12, for example, an $In_xGa_{1-x}As$ epitaxial layer grown on the substrate, where x is greater than about 0.01 and less than about 0.53, and a cap layer 16. The epitaxial layer 12 is grown lattice mismatched on the GaAs substrate 14, although it can be grown lattice mismatched on InP. In certain implementations, after growing the $In_{0.22}Ga_{0.78}As$ absorbing layer 12 the thin (500 Å) GaAs cap layer 16 is grown. GaAs has a wider bandgap than $In_{0.22}Ga_{0.78}As$ and when placed between the $In_{0.22}Ga_{0.78}As$ layer 12 and metal contacts 18 acts a barrier to reduce dark current. The cap layer 16 is sufficiently thin so as to not hamper photogenerated charge transport. For applications where there is no strong electric field present, as is the case when the switch 10 functions as a sampling gate, the wide bandgap cap layer 16 may seem to be a hindrance to charge transport. Electron and holes will not easily surmount this great a discrepancy in the bandgap, especially in the presence of a weak optical signal. In accordance with the invention, however, the optical pulse intensity is typically relatively high (~$10^9$ W/cm$^{-2}$), which helps to diminish the bandgap discontinuity during the time the photoconductive gate is activated. As with the $In_{0.22}Ga_{0.78}As$ layer 12, the GaAs cap layer 16 is grown lattice mismatched but is sufficiently thin to minimize or eliminate surface roughness.

Thus, it would seem to go counter to conventional thinking to grow $In_{0.22}Ga_{0.78}As$ directly onto a GaAs substrate, especially a layer as thick as 1 μm. The large mismatch would be more than sufficient to cause lattice relaxation and significant surface roughness. As with LT-GaAs, the process of growing LT-$In_{0.22}Ga_{0.78}As$ significantly increases the amount of arsenic in the lattice by as much as 1% over what is incorporated under stoichiometric growth conditions. (Note that LT-$In_{0.22}Ga_{0.78}As$ is sometimes written as $In_{0.22}Ga_{0.78}As$:As, although this speaks only of the introduction of a dopant and does not indicate the post annealing process.) It is reasonable to think that the excess arsenic combined with the increased lattice constant for the 22% In concentration would only further stress the epilayer with respect to the GaAs substrate. As it happens, the introduction of excess arsenic does not exacerbate the mismatch problem and may actually serve to relieve stress in the epitaxial layer. Presumably, neither general roughening nor cross hatch occurs due either to limited Group III mobility or reduced misfit dislocation glide or both at such low temperatures. Regardless of the microscopic mechanism, the result is an epitaxial layer that appears smooth under a microscope.

The growth procedure for the switch 10 is as follows: 3 inch epi-ready GaAs (or InP) substrates 14 are used. If a GaAs substrate is used, a non-intentionally doped, stoichiometric GaAs layer is first grown to stabilize the surface. If an InP substrate is used, a lattice-matched, non-intentionally doped InAlAs layer would first be grown. The temperature is then lowered to 170 C and the $In_{0.22}Ga_{0.78}As$ epitaxial layer 12 is grown. In various implementations, the amount of In has been set using the data found in FIG. 2. It is apparent from these curves that at least 10% In is employed to provide useful absorption. About 22% is chosen as a starting point for use at 1064 nm, although a higher percentage In further increases absorption and is more sensitive. For In concentrations greater than 27%, an InP substrate has less strain than GaAs. If it is found that substationally higher dark currents pose little problem for a given photoconductive application, the amount of In can be increased to 30-40%. Once the desired thickness of $In_{0.22}Ga_{0.78}As$ layer 12 is grown, the cap layer 16 is grown. The cap layer 16 can include stoichiometric GaAs, non-stoichiometric GaAs (LT-GaAs), AlGaAs, InAlAs or InP, to name a few compounds. Its thickness can be a few monolayers to >1000 Å. Once the cap layer 16 is grown, the epi-structure is post-annealed at 600 C for about 1 to 30 minutes, depending on the carrier lifetime and resistivity the user desires. Post annealing for shorter times results in a faster carrier lifetime but lowers the resistivity (i.e. increases dark current). Long post annealing slows the carrier lifetime. After post annealing, the 3 inch wafer is pulled from the reactor and microfabrication begins.

To further lower dark current, the LT-$In_{0.22}Ga_{0.78}As$ is etched into a mesa and benzocyclobutene (BCB) 20 is employed to further reduce leakage (see FIG. 3). In addition to lowering dark current, removing the unnecessary $In_{0.22}Ga_{0.78}As$:As from the surface assures that the free carriers in this epitaxial layer are not present to absorb the terahertz signal as it propagates through the substrate 14 and couples to an antenna. The electrical contacts 18 are two electrodes separated by a gap (photoconductive switch) deposited over the BCB 20 with the gap positioned on top of the $In_{0.22}Ga_{0.78}As$ mesa. After the metalization, the mesa region an antireflection coating can be applied. The opposite ends of the electrodes 18 are then electrically connected to other devices in the system. A bias can be applied when the switch 10 is used as a picosecond/terahertz generator. An amplifier can be applied when the switch 10 is used as a sampling gate or mixer.

Depending on the application, the $In_xGa_{1-x}As$ layer 12 may have a thickness in the range between about 0.1 and 2.0 μm. In some implementations, the substrate 14 temperature is at a temperature in the range between about 125 and 225 C during the growth of the $In_xGa_{1-x}As$ layer to render the growth process nonstoiciometric and arsenic rich.

The wider bandgap epitaxial cap layer 16 may have a thickness in the range between about 50 and 1000 Å. In various implementations, the wider bandgap epitaxial cap layer can be stoichiometric GaAs or nonstoichiometric GaAs, stoichiometric AlGaAs or nonstoichiometric AlGaAs, or stoichiometric InAlAs or nonstoichiometric InAlAs, grown at a temperature in the range between about 125 and 225 C.

In certain implementations, the switch 10 is subjected to an in-situ or ex-situ post annealing process after the epitaxial structure is grown. The post annealing temperature may be in the range between about 400 and 700 C, and the post annealing duration may be in the range between about 5 and 30 min.

The switch may be patterned and etched down to the substrate except for a small region or mesa that remains unetched. The mesa may be substantially round in shape with a diameter in the range between about 10 and 100 μm. An electrically insulating, photo-defined dielectric film may be deposited over the surface of the semiconductor structure except in a region, defining a window, centered over the top surface of the mesa. In certain implementations, the photo-defined window in the dielectric film is substantially round in shape and smaller in diameter than the top diameter of the mesa. For example, the dielectric film has a diameter in the range between about 5 and 90 μm in particular implementations. Electrical contacts having two thin film electrodes may be deposited on the dielectric film with a gap between them that is positioned such that the gap and portions of each electrode are in the window of the dielectric film and make contact with the top semiconductor structure surface of the mesa. The semiconductor surface between the two electrodes may be coated with an antireflective coating.

In some implementations, the structure generates pulsed or sinusoidally varying electrical signals when an electrical bias is applied across the two electrodes and an optical pulse or sinusoidally varying optical signal is incident in the gap and excites carriers in the photoconductive gap. A radiating antenna may be connected to the two electrodes, so that the electrical signals with subterahertz to terahertz bandwidths radiate from the antenna. A voltage from a pulsed or sinusoidally varying electrical waveform may be applied across the two electrodes and an optical pulse or sinusoidally varying optical signal may be incident in the gap and may excite carriers in the photoconductive gap to measure the electrical waveform. A receiving antenna may be connected to the two electrodes, so that the electrical waveform with subterahertz to terahertz bandwidths is coupled to the photoconductive gap through the receiving antenna. The substrate side may be coated with an antireflection coating and light may enter from the substrate side to excite carriers in the photoconductive gap.

The present invention has been described with reference to specific embodiments, which are provided only for exemplification and are not to be construed as limiting the scope of the invention as defined by the following claims.

What is claimed is:

1. A semiconductor structure comprising:
a GaAs or InP substrate;
an InxGa1-xAs epitaxial layer grown on the substrate, x being greater than about 0.01 and less than about 0.53;
a wider bandgap epitaxial layer grown as a cap layer on top of the $In_xGa1_{-x}As$ epitaxial layer;
wherein the structure is patterned and etched down to the substrate except for a small region or mesa that remains unetched;
wherein the mesa is substantially round in shape; and
wherein the diameter of the mesa is in the range between about 10 and 100 μm.

2. The semiconductor structure of claim 1 further comprising an electrically insulating, photo-defined dielectric film deposited over the surface of the semiconductor structure except in a region, defining a window, centered over the top surface of the mesa.

3. The semiconductor structure of claim 2 wherein the photo-defined window in the dielectric film is substantially round in shape and smaller in diameter than the top diameter of the mesa.

4. The semiconductor structure of claim 3 wherein the window in the dielectric film has a diameter in the range between about 5 and 90 μm.

5. The semiconductor structure of claim 4 further comprising electrical contacts having two thin film electrodes deposited on the dielectric film and having a gap between them that is positioned such that the gap and portions of each electrode are in the window of the dielectric film and make contact with the top semiconductor structure surface of the mesa.

6. The semiconductor structure of claim 5 wherein the semiconductor surface between the two electrodes is coated with an antireflective coating.

7. The semiconductor structure of claim 5 wherein the structure generates pulsed or sinusoidally varying electrical signals when an electrical bias is applied across the two electrodes and an optical pulse or sinusoidally varying optical signal is incident in the gap and excites carriers in the photoconductive gap.

8. The semiconductor structure of claim 5 further comprising a radiating antenna electrically connected to the two electrodes, the electrical signals having subterahertz to terahertz bandwidths that radiate from the antenna.

9. The semiconductor structure of claim 5 wherein a voltage from a pulsed or sinusoidally varying electrical waveform is applied across the two electrodes and an optical pulse or sinusoidally varying optical signal is incident in the gap and excites carriers in the photoconductive gap to measure the electrical waveform.

10. The semiconductor structure of claim 9 further comprising a receiving antenna electrically connected to the two electrodes, the electrical waveform having subterahertz to terahertz bandwidths being coupled to the photoconductive gap through the receiving antenna.

11. The semiconductor structure of claim 5 wherein the substrate side is coated with an antireflective coating and light enters from the substrate side to excite carriers in the photoconductive gap.

12. The semiconductor structure of claim 1, wherein the semiconductor structure is a photoconductive device.

* * * * *